United States Patent [19]

Grandfield et al.

[11] Patent Number: 4,791,377

[45] Date of Patent: Dec. 13, 1988

[54] DIRECT FREQUENCY SYNTHESIZER

[75] Inventors: John Grandfield, Assonet; James T. Campbell, Sherborn; Carl H. Gundel, Needham; William Shillue, Norwood, all of Mass.

[73] Assignee: GTE Government Systems Corporation, Waltham, Mass.

[21] Appl. No.: 110,396

[22] Filed: Oct. 20, 1987

[51] Int. Cl.⁴ ............... H03B 21/02; H03B 19/00
[52] U.S. Cl. ............................ 328/14; 331/40; 328/27; 455/314
[58] Field of Search ............ 328/14, 15, 27, 29, 328/25, 30, 109; 331/39, 40

[56] References Cited

U.S. PATENT DOCUMENTS

| | | | |
|---|---|---|---|
| 3,454,883 | 7/1969 | Oropeza et al. | 328/14 |
| 3,838,355 | 9/1974 | Papaieck | 328/14 |
| 4,425,552 | 1/1984 | Stirling | 331/39 |

OTHER PUBLICATIONS

Budreau, "Compact Fast-Hopping Frequency Synthesizer for Spread-Spectrum Systems", 1982 IEEE Military Communications Conference Record, vol. 1, pp. 9.3-1 to 9.3-3.
"Microwave Frequency Synthesizers", by R. Stirling, Prentice Hall 1987, pp. 44-53.

Primary Examiner—Stanley D. Miller
Assistant Examiner—Richard Roseen
Attorney, Agent, or Firm—J. Stephen Yeo

[57] ABSTRACT

A frequency synthesizer has in series a digital synthesizer, mix and divide circuits, and a mix only circuit. Each mix and divide circuit includes a mixer having an IF input, a LO input and a RF output, a filter, and a frequency divider. A segment of a digital word selects a tone from a tone generator and also selects a passband of the filter. The selected tone is coupled to the LO input of the mixer. The frequency divider divides the filtered RF output of the mixer. The mix only circuit is at the output of the last of the series connected mix and divide circuits. The mix only circuit is similar to a mix and divide circuit, but does not have a frequency divider. The digital synthesizer provides a signal to the input of the first of the series connected mix and divide circuits, the frequency of which corresponds to a segment of a digital word. The filter is preferably a voltage tunable bandpass filter.

3 Claims, 6 Drawing Sheets

DIRECT FREQUENCY SYNTHESIZER

RELATED COPENDING APPLICATIONS

Voltage Tunable Half Wavelength Microstrip Filter, Ser. No. 07/100,755, filed Oct. 20, 1987, U.S. Pat. No. 4,757,287 is concerned with a tunable filter which may be used as a component of the present invention.

BACKGROUND OF THE INVENTION

This invention pertains to radio frequency generators, and more particularly is concerned with frequency synthesizers.

Frequency hopping synthesizers rapidly shift or "hop" from one transmission carrier frequency to another. They are often used in satellite communication systems where hostile interception or jamming is to avoided.

"Direct" frequency synthesizers are a class of synthesizers in which the output frequency is created without the need for retuning an oscillator. In contrast, the class of synthesizers designated "indirect" utilizes a phase-locked loop with a programmable divide-by-N counter to synthesize an output frequency "indirectly" related to a reference oscillator. The direct synthesizer offers a significant speed advantage in frequency hopping as the need for relocking a phase-locked loop is avoided, thereby allowing faster selection of the frequencies.

Prior to the present invention, direct frequency synthesizers used one of two approaches; (1) an iterative mix-and-divide approach; and (2) a digital look-up table approach.

An iterative mix-and-divide synthesizer contains N mix-and-divide stages connected in series. Each stage, for example, may include a frequency mixer, a 4-to-1 local oscillator selector switch, a fixed upper side band filter and a divide-by-four frequency counter. Four phase locked oscillators generate four LO frequencies or tones, $F_1$, $F_2$, $F_3$, and $F_4$ which are routed to the 4-to-1 switches which selects one tone to be coupled to the LO port of the corresponding mixer in each of the N identical mix-and-divide stages. The small number of tones are repeatedly mixed to derive an output frequency. It is known to use a bank of four bandpass filters at the output of each mixer to reject spurious signals and leakage. The output frequency is determined by a digital word, 2 bits of which may control the 4-to-1 RF switch and filter selection in each mix-and-divide stage. The need for four bandpass filters results in increased weight, bulk, and cost.

To select one of $2^N$ frequencies across the programmable bandwidth B, requires N/2 mix-and-divide stages. The programmable bandwidth B is determined by the frequency separation of the four phase locked oscillators such that $B = 4/3 (F_4 - F_1)$. The minimum frequency step size is equal to $B/2^N$. The mix-and-divide synthesizer has the disadvantage of requiring a large amount of stages to produce the desired incremental frequency steps over a large bandwidth. For example, a mix-and-divide synthesizer of 1 GHz bandwidth and 1 Hz incremental step size requires more than 14 mix-and-divide stages ($4^{14} \times 1Hz = 268,435,456$ Hz).

A digital look-up table synthesizer on the other hand consists of a parallel register to store a phase increment word, a parallel digital adder, an output parallel register, a phase-to-sine amplitude look-up table, a high speed D/A converter and a low pass filter at the output. In this technique, different frequencies are generated by adding different phase increments with a uniform high speed clock to the digital circuitry. The number of programmable frequencies is a function of the size of the phase increment adder and the number of phase samples desired per output frequency. The minimum number of samples is usually three for spectral purity reasons. The programmable bandwidth is determined by the maximum clock speed of the digital circuitry and D/A converter, the minimum number of phase samples at the highest frequency and the desire to avoid in-band harmonics for the lowest frequency. Thus for a high speed clock frequency $f_c$, the programmable bandwidth is $f_c/3 - f_c/6$, or $f_c/6$.

The digital look-up table synthesizer, while much more compact that the mix-and-divide, has more limited programmable bandwidth and poorer spectral purity. This is because current digital and D/A technology limits the high speed clock frequency to less than 300 MHz. The corresponding useable programmable bandwidth is thus 50 MHz or less. The limited word size of the D/A converter introduces white gaussian sampling noise down approximately 48 dB in total power from the power of the desired output sine wave signal. In addition, in-band discrete spurious signals may be as little as 45 dB below the power of the desired output frequency at the output of the D/A converter.

SUMMARY OF THE INVENTION

Briefly, according to one aspect of the invention, a frequency synthesizer has an arrangement of a digital synthesizer, mix and divide circuits, and a mix only circuit.

Several mix and divide circuits are connected in series. Each mix and divide circuit includes a mixer having an IF input, a LO input and a RF output, a filter, and a frequency divider. A segment of a digital word selects a tone from a tone generator and also selects a passband of the filter. The selected tone is coupled to the LO input of the mixer. The frequency divider divides the filtered RF output of the mixer. The mix only circuit is at the output of the last of the series connected mix and divide circuits. The mix only circuit is similar to a mix and divide circuit, but does not have a frequency divider. The digital synthesizer provides a signal to the input of the first of the series connected mix and divide circuits, the frequency of which corresponds to a segment of a digital word.

As another aspect of the invention, the filter is a voltage tunable bandpass filter.

DETAILED DESCRIPTION OF THE INVENTION

Figure 1:
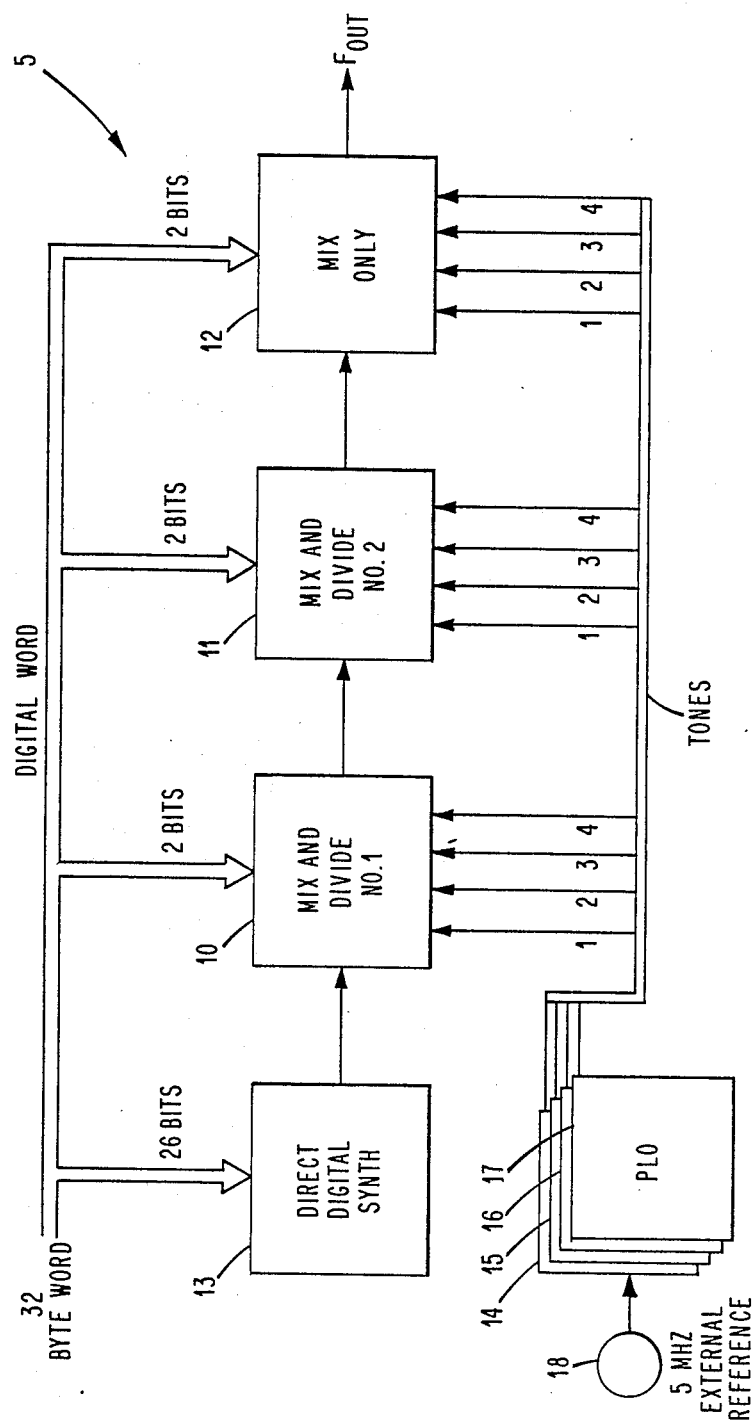
FIG. 1 is a block diagram of a frequency synthesizer embodying the invention.

Referring to FIG. 1, an extended bandwidth frequency synthesizer 5 representing an embodiment of the invention consists of a series arrangement of a frequency source 13, preferably a digital direct synthesizer, two mix-and-divide stages 10, 11, and one mix only output stage 12 for the final stage. The mix-only stage 12 is similar to mix and divide stages 10 and 11 but is without the divide-by-four circuit present in stages 10 and 11. The number of circuits, frequencies, and other design variables are given by way of example only.

The digital direct synthesizer 13 feeds the IF port of first mix and divide stage 10 with frequency $f_D$. In this example $f_D$ is in the range of 625 to 875 MHz. Four phase locked oscillators PLO 14, 15, 16, and 17 provide tones $F_1$, $F_2$, $F_3$ and $F_4$ which are distributed to each stage 10, 11, and 12.

The oscillators 15, 16, 17, and 18 are phased locked to a 5 MHz reference oscillator 18. The synthesizer 5 is commanded by a 32-bit digital word which can select any of $2^{32}-1$ or 4,294,967,295 frequencies across the programmable bandwidth B. Of a 32 bit word, 2 bits are used to control the tone processed by each stage 10, 11, and 12. The remaining 26 bits control direct digital synthesizer to obtain $f_D$. Bandwidth B is a function of the uniform frequency spacing between the four tones, $F_1$, $F_2$, $F_3$, and $F_4$. The selected output frequency f out from mix-only circuit 12 is:

$$f_{out} = f_{s3} + \frac{\left( f_{s2} + \frac{[f_{s1} + f_D]}{4} \right)}{4}$$

where
- $f_{s3}$ = selected tone ($F_1$, $F_2$, $F_3$ or $F_4$) in the mix-only stage 12
- $f_{s2}$ = selected tone in the mix-and-divide stage 11
- $f_{s1}$ = selected tone in the mix-and-divide stage 10
- $f_D$ = output frequency of the direct digital synthesizer 13

The following is an example set of phased locked oscillator tones:
- $F_1$ = 1875 MHz
- $F_2$ = 2125 MHz
- $F_3$ = 2375 MHz
- $F_4$ = 2625 MHz In this example the output programmable bandwidth is 1 GHz over the frequency range 2.5 GHz to 3.5 GHz. The minimum frequency step size is $B/2^{32}$, or approximately 0.23 Hz.

Figure 2:
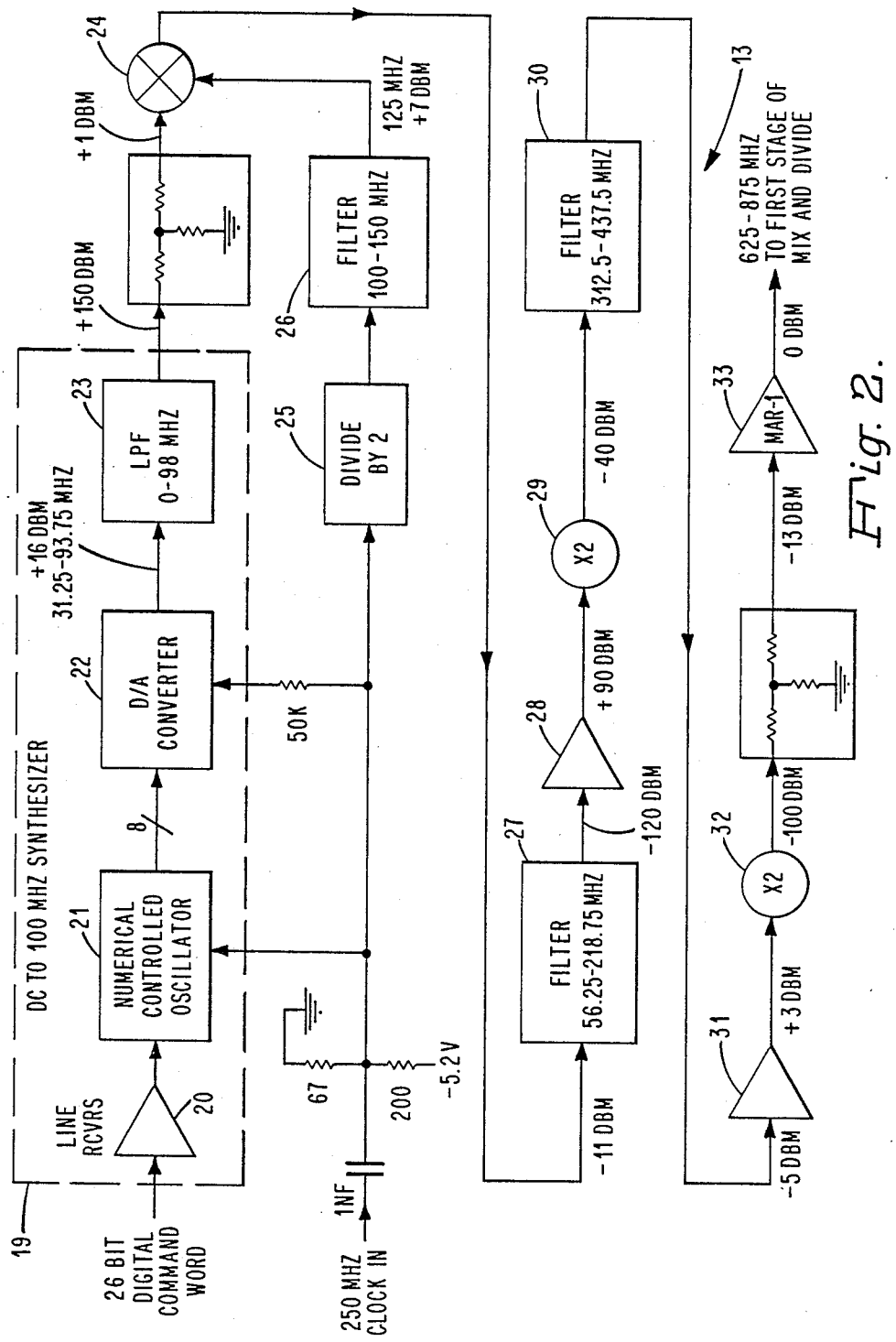
FIG. 2 is a block diagram of a digital synthesizer used in the frequency synthesizer of the FIG. 1.

A block diagram of one embodiment of digital synthesizer 13 is shown in FIG. 2. The digital synthesizer 13 shown is a hybrid of digital and analog circuits. The digital circuit includes a DC to 100 MHz synthesizer 19, which is controlled by 26 bits of a 32 bit digital command word which is stored by line receiver 20 for use by numerical controlled oscillator 21. The numerical controlled oscillator 21 may be a STI 2172 chip manufactured by STI which includes an incremental phase register, a parallel adder, a phase accumulator, and a phase to sine amplitude look table ROM. Numerical controlled oscillator 21 provides an 8-bit digital output represent samples of one of $2^{26}$ frequencies in the band 31.25 MHz to 93.75 MHz as selected by the digital command word.

The 8-bit output is processed by a high speed digital to analog converter 22 and a 0–98 MHz low pass filter 23 to provide a 31.25–93.75 MHz sine wave. Numerical controlled oscillator 21 and digital to analog converter 22 are synchronized by a 250 MHz clock signal.

The 31.25–93.75 MHz sine wave from synthesizer 19 is upconverted to 156.25–218.75 MHz by mixer 24 which has a 125 MHz LO signal. The 125 MHz LO may be derived by dividing the 250 MHz clock by divide by 2 circuit 25 and filtering the divided signal by 100–150 MHz bandpass filter 26. Mixer 24 may be a Mini-Circuits TSM-2. A suitable commercially available divider circuit is the Motorola M1678.

The 156.25–218.75 MHz signal from mixer 24 is passed through bandpass filter 27 amplified by RF amplifier 28 and directed to the input of frequency coupler 29 which results in a 312.5–437 MHz signal. This signal is filtered by bandpass filter 30, amplified by RF amplifier 31, doubled to 626–875 MHz by frequency coupler 32 and amplified by RF amplifier 33. RF amplifiers 28, 31 and 33 may be Mini-Circuits MAR-8, MAR-2, and MAR-3 respectively. Frequency couplers 29 and 32 may both be Mini-Circuits SK-2. The amplifier 625–875 MHz signal, $f_D$, from digital synthesizer 13 is coupled to the first mix and divide stage 10.

Mix and divide circuit 10 will now be described with reference to FIG. 3. The input of circuit 10 is a 625 to 875 MHz bandpass filter 34 which rejects spurious signals outside hhe band. Filter 34 is coupled to the IF port of mixer 35. The 625–875 MHz signal is then mixed with the tone fS1 selected by 2 bits of the digital command word to upconvert it to 2500 to 3500 MHz. A suitable commercially available mixer is the RA43 sold by Watkins-Johnson.

The RF output of mixer 35 is amplified by RF amplifier 36 and filtered by a variable bandpas filter 37. A suitable commercially available RF amplifier is the RA43 sold by Watkins-Johnson. Filter 37 has a passband less than the possible output programmable bandwidth, but which can be tuned over the 2500 to 3500 MHz output bandwidth. The filter 37 is tuned to the sum of $f_D$ and fS1 by the same two bits of the digital command.

Variable bandpass filter 37 rejects potential inband spurious signals allowing only RF signals in the selection portion of the band of 2500 to 3500 MHz to pass.

Figure 4:
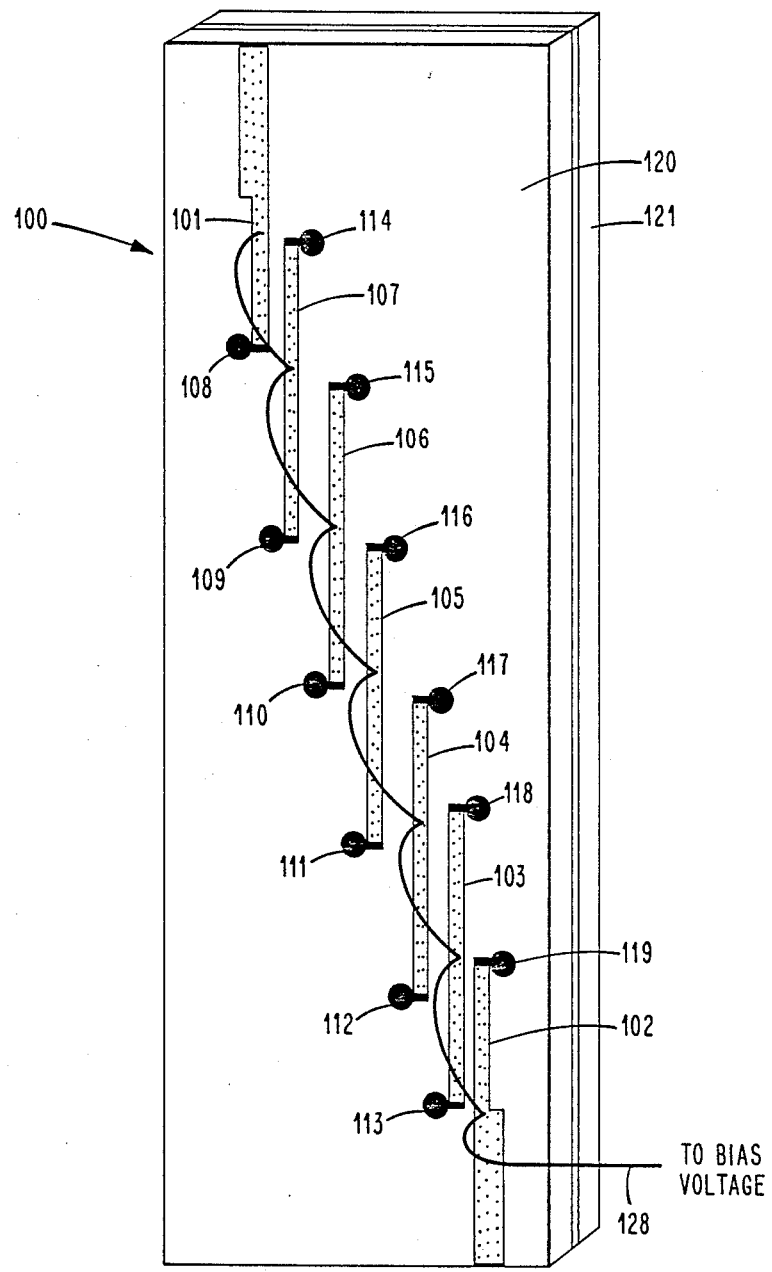
FIG. 4 represents a tunable microstrip filter used in the mix and divide circuit of FIG. 3.

A tunable microstrip filter 100 suitable for use as voltage tunable bandpass filter 37 is seen in FIG. 4. The particular filter illustrated is a five pole coupled line bandpass filter having seven parallel lines 101–107, offset and spaced apart. The lines are on a dielectric substrate 120 mounted to a ground plane 121.

Two of the filter lines 101, and 102 are approximately one-quarter wavelength long and have only one open circuit end each, while the remaining five lines 103–107 are approximately one-half wavelength long and have two open circuit ends each. The lengths are calculated for a design frequency.

Resonance occurs at the frequency at which each open ended line is exactly one half wavelength long. The open circuit ends of the lines are high impedance, and the centers of the lines are low impedance. As the high impedance sections are aligned across from the low impedance centers, energy is effectively coupled across the gaps at resonance. At frequencies lower or higher than the passband, the resonance condition does not exist and energy is reflected at the filter input, rather than transmitted to the output. The widths and spacings of the lines determine the bandwidth and the nature of the inband response, which is, preferably, Chebyshev, or equiripple, to minimize the variation in inband loss. Each open circuit end of a filter line is coupled to the ground plane 121 through a corresponding varactor 108-119.

A varactor is a two electrode pn diode which functions as a voltage controlled capacitor. A positive voltage bias applied to the cathode decreases the capacitance.

Figure 5:
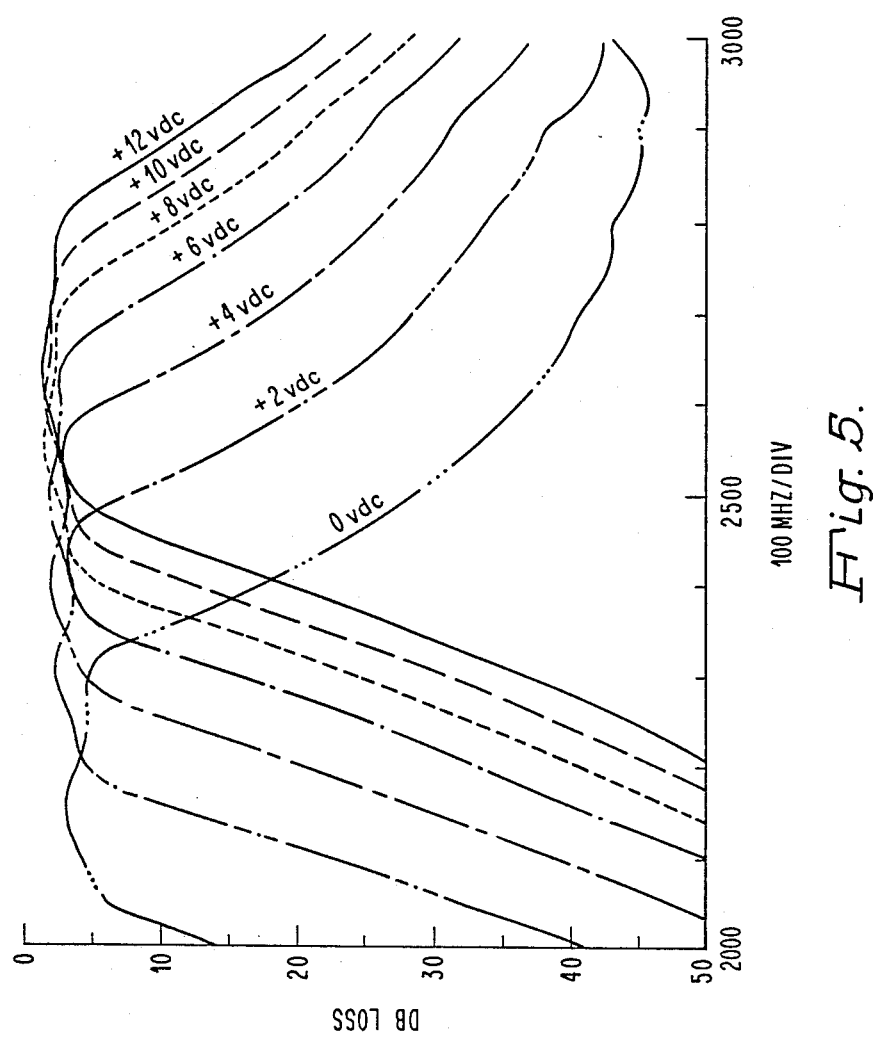
FIG. 5 is a set of curves showing how the passband of the filter changes with voltage.

The varactors provide means of controlling the response of the filter. A change in the bias voltage will yield a corresponding change in the center frequency of the filter as seen in FIG. 5. The parallel lines of the filter can be modeled as a distributed LC filter. The varactors add a lumped capacitance to the open circuit ends of each line, which makes the effective electrical length of the line longer, and upsets the optimized Chebyshev response of the filter. The effect of a longer line is to make the half-wave frequency lower, and thus the passband range is shifted down. As the bias on the varactors is varied to increase their capacitance, the passband moves lower.

Because the filter 10 can be tuned with very small capacitances, and the presence of any large capacitance upsets the filter performance, it is necessary to choose varaction diodes with the smallest available package capacitance, and a capacitance ratio that would allow the filter to be tuned over the desired band, e.g. 2500-3500 MHz in the example. The package must also be chosen to fit easily into a microwave assembly. A suitable varactor is type GC51105-82. For the five pole filter shown twelve varactors are used.

Figure 6:
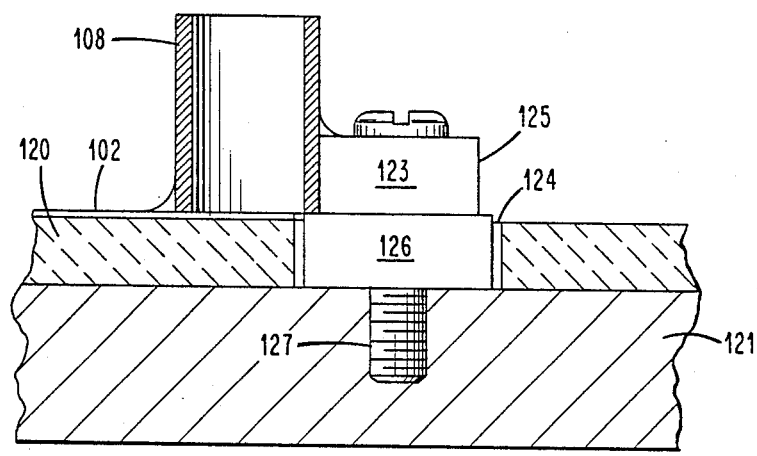
FIG. 6 illustrates a ground plane extender used in the filter of FIG. 4.

A common method of connecting components to an aluminum ground plane uses silver epoxy, which may impregnate the dielective material and compromise the performance of the circuit. To avoid this potential problem a ground plane extender 122 may be provided as seen is FIG. 6. The ground plane extender also assures that each varactor has a low inductive path to ground.

The ground plane extender 122 includes a metal (e.g. brass) pedestal 123 which extends through a hole 124 in the dielective substrate 120 in proximity to the open circuit end of a filter line, e.g. 102. The pedestal 125 may be circular with two segments 126, and 127, the upper segment 126 having a slightly smaller diameter than the lower segment 127. The pedestal 123 is secured by a through screw 127 which is threaded in a tapped hole in the metal substrate 121. One electrode of a varactor, e.g. 108 is soldered to the pedestal 123 with the other electrode soldered to the open end of a filter strip, e.g. 102.

The polarity of each varactor is arranged the same way. For example, the anode may be soldered to the ground plane extender and the cathode soldered to the filter line.

As seen in FIG. 4, bias voltage may be applied to the varactors through a thin wire 128 soldered or otherwise connected to the centers of the half wavelength filter sections, and at the transition of each quarter wave section. The wire is thus a quarter wavelength from each varactor. A single bias voltage source biases all the varactors of a filter.

Figure 7:
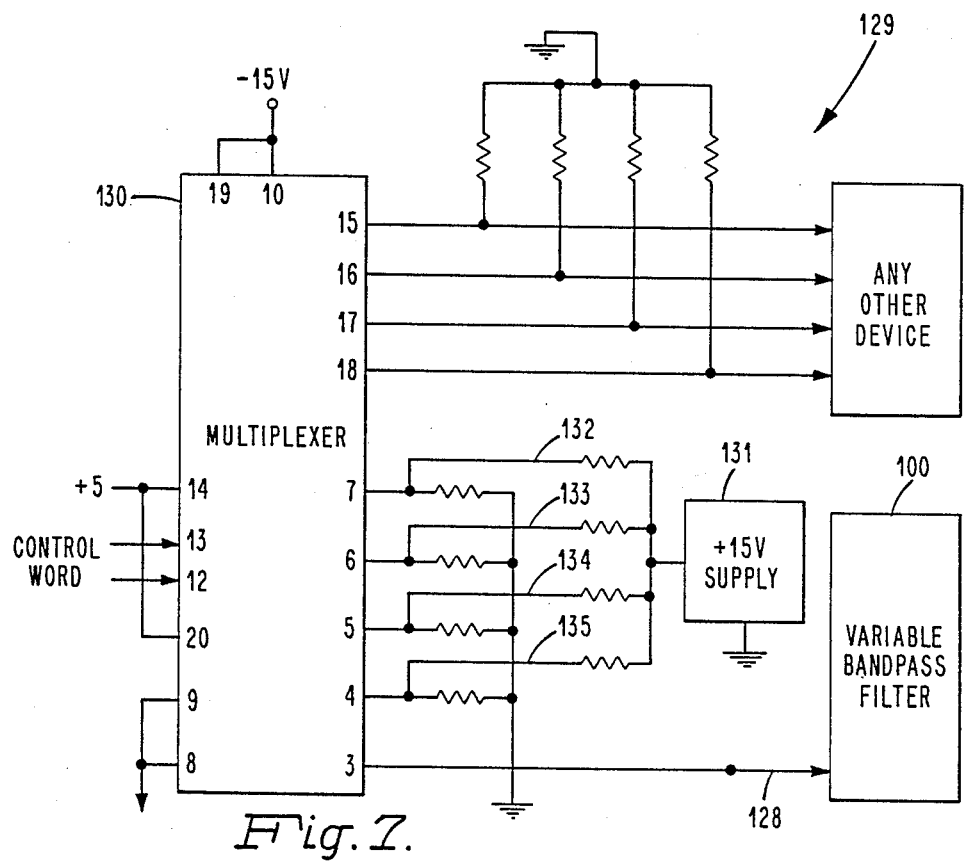
FIG. 7 is a schematic representation of a digitally controlled circuit for the filter of FIG. 4.

The bias voltage level may be digitally controlled by the control circuit 129 such as seen in FIG. 7. A high speed multiplexer 130 converts two bits of a digital control signal into one of four bias voltages for the filter. A Harris HI 518-T multiplexer may be used. A d.c. voltage supply 131 is coupled through four voltage divider circuits 132-135 to the multiplexer. The multiplexer couples one of the four voltage divider circuits to the bias wire of the tunable filter in response to the two bit control. Similarly, multiplexer controls the tone selection four to one switch 39 by the same two control bits. Four additional voltage divider circuits 136-139 are used.

Figure 3:
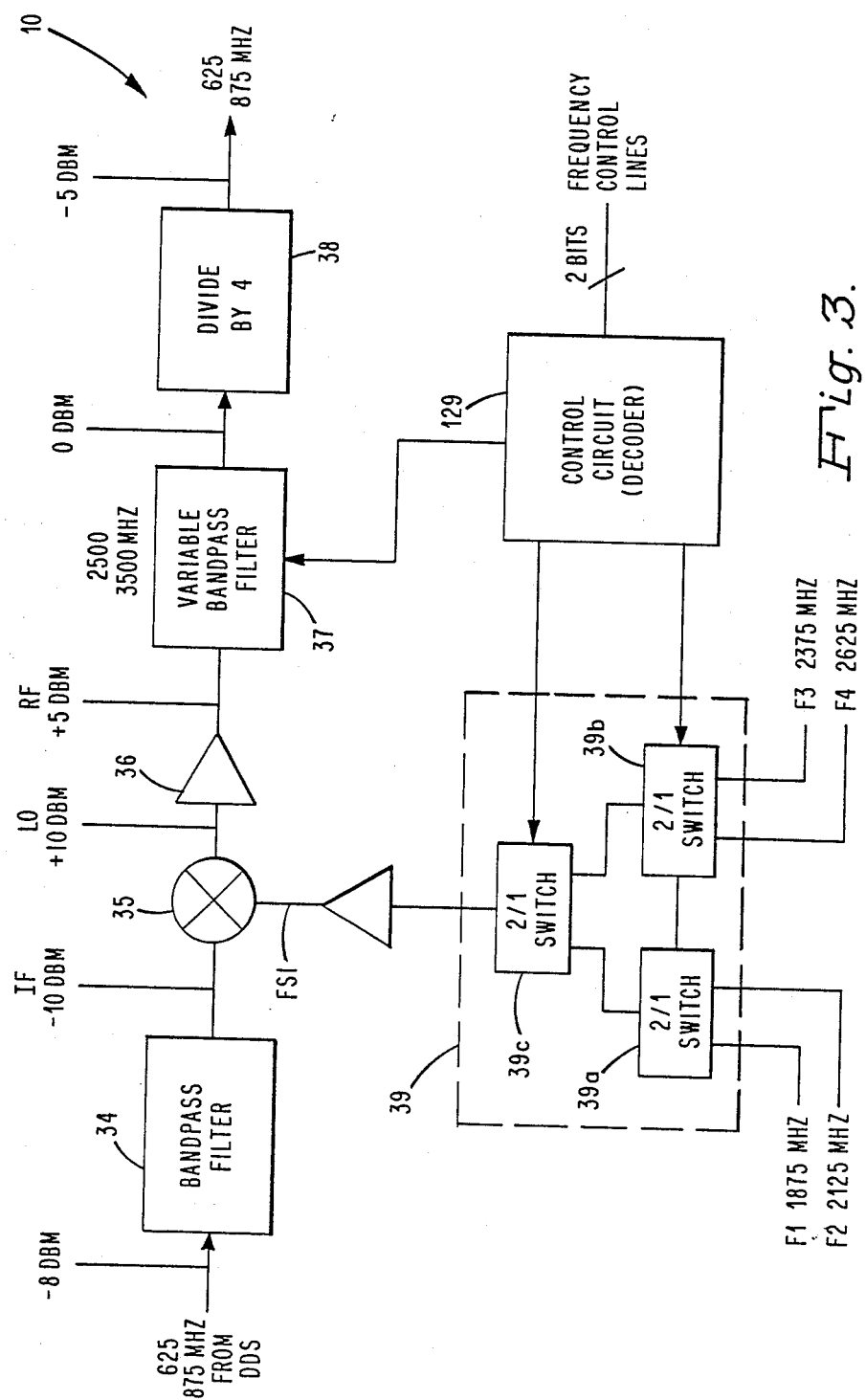
FIG. 3 is a mix and divide circuit used in the frequency synthesizer of FIG. 1.

Returning now to the mix and divide stage of FIG. 3, the filtered signal is divided by four divider 38 such as available from Fujitsu to result in a signal in the band of 625-875 MHz. The two bits are used by the multiplexer to control four to one switch 39 which couples one tone at a time to the LO port of mixer 36. Four to one switch 39 may include three two to one switches 39a, 39b, and 39c connected as shown. Switches 39a, 39b, and 39c may be commercially available GaAs switches available from Microwave Associates. As the same two bits from the digital command word adjust variable bandpass filter 37 and select the tone fS1, unwanted mixer products and tone leakage are rejected. The filtered 625 to 875 MHz signal is directed to second stage 11.

Mix and divide stage 11 is identical to stage 10. The process discussed for stage 10 is repeated by second mix-and-divide stage 11, where the next two more significant bits from the command word are used to select fS2 from one of the four tones $F_1$, $F_2$, $F_3$, and $F_4$ to be mixed with the output of the first mix and divide stage 10. The filter output from stage 11 is also in the frequency band 625 MHz to 875 MHz, allowing the stages 10 and 11 to be of identical design. It should be noted the spectral purity of the digital look-up table synthesizer, while degraded by the times four frequency multiplication by doublers 24 and 25, is actually enhanced by successive divide-by-four operations in the two mix-and-divide stages 10 and 11. The net result is a spectral improvement of 12 dB.

The final stage 11 differs from the mix-and-divide stages 10, and 11 only in that it does not contain a divide-by-four circuit. Thus the output is both four times wider in bandwidth and four times higher in frequency or (625 to 875)×4=2.5 GHz to 3.5 GHZ.

The invention advances both the mix-and-divide and digital look-up table synthesizer approaches in ways which overcomes the disadvantages of each. By replacing all but the three output stages of the mix-and-divide with a digital look-up table synthesizer, approximately seventy five percent of the RF circuitry of a pure mix-and-divide synthesizer is eliminated. At the same time the successive division by four in two of the three output stages improves the spectral purity of the digital look-up table synthesizer by 24 dB and expands its bandwidth by a factor of 4. An important feature is the use of voltage tunable bandpass filters which reject spurious signals in the 2500 to 3500 MHz band which would otherwise pass. Following the invention the high performance of the mix-and-divide synthesizer is realized at a fraction of the former implementation cost.

One application for the frequency synthesizer is secure communication systems. Corresponding transmitter and receiver are synchronized to the same digital command word. The receiver would have similar mix and divide stages as the synthesizer to demodulate the frequency hopped signal.

The preferred embodiment and best mode of the invention has been described using examples of frequencies and components. It will be appreciated by those skilled in the art that modifications may be made, yet remain within the scope of the claims.

We claim:

1. A frequency synthesizer comprising:
   a. tone generating means for providing a plurality of tones;
   b. a plurality of series connected mix and divide circuits, including a first and a last mix and divide circuit, each mix and divide circuit including a mixer having an IF input, an LO input and a RF output, filter means for filtering the RF output of said mixer with a selectable passband; means for selecting a tone from said tone generating means and selecting a passband of said filter means in response to a segment of a digital word; means for coupling the selected tone to the IF input of said mixer, and frequency divider means for dividing the filtered RF output of said mixer;
   c. a mix only circuit at the output of the last of said series connected mix and divide circuits, said mix only circuit including a mixer having an IF input, a LO input and a RF output, filter means for filtering the RF output of said mixer with a selectable passband, means for selecting a tone from said tone generating means and selecting a passband of said filter means in response to a segment of a digital word; means for coupling the selected tone to the IF input of said mixer, and
   d. a digital synthesizer for providing a signal to the input of the first of said series connected mix and divide circuits, the frequency of said signal corresponding to a segment of a digital word.

2. The frequency synthesizer of claim 1 wherein said filter means is a voltage tunable bandpass filter.

3. A frequency synthesizer comprising:
   a. tone generating means for providing a plurality of tones;
   b. a plurality of series connected mix and divide circuits including a first and last mix and divide circuit, each mix and divide circuit including a mixer having an IF input, a LO input and a RF output, filter means for filtering the RF output of said mixer with a selectable passband; means for selecting a tone from said tone generating means and selecting a passband of said filter means in response to a segment of a digital word; means for coupling the selected tone to the IF input of said mixer; and frequency divider means for dividing the filtered RF output of said mixer;
   c. a mix only circuit at the output of the last of said series connected mix and divide circuits; said mix only circuit including a mixer having an IF input, a LO input and a RF output, a voltage tunable bandpass filter for filtering the RF output of said mixer with a selectable passband, means for selecting a tone from said tone generating means and selecting a passband of said voltage tunable bandpass filter in response to a segment of a digital word, means for coupling the selected tone to the IF input of said mixer; and
   d. a signal source for providing a signal to the input of said series connected mix and divide circuits, the frequency of said signal corresponding to a segment of a digital word.

* * * * *